US007292836B2

(12) United States Patent
Endress et al.

(10) Patent No.: US 7,292,836 B2
(45) Date of Patent: Nov. 6, 2007

(54) DIRECT CONVERSION RECEIVER

(75) Inventors: Friedrich Endress, Renningen (DE);
Luc Dartois, Carrieres sous Poissy (FR)

(73) Assignee: Evolium S.A.S., Paris (FR)

( * ) Notice: Subject to any disclaimer, the term of this patent is extended or adjusted under 35 U.S.C. 154(b) by 790 days.

(21) Appl. No.: 10/701,636

(22) Filed: Nov. 6, 2003

(65) Prior Publication Data

US 2004/0127188 A1    Jul. 1, 2004

(30) Foreign Application Priority Data

Dec. 30, 2002    (EP) ................................. 02360380

(51) Int. Cl.
*H04B 1/26* (2006.01)
*H04B 1/10* (2006.01)

(52) U.S. Cl. .................... 455/324; 455/302; 455/334

(58) Field of Classification Search ............... 455/63.1, 455/67.11, 67.13, 295, 296, 302, 303, 313, 455/323, 324, 334, 552.1, 553.1; 375/320, 375/322, 346, 347
See application file for complete search history.

(56) References Cited

U.S. PATENT DOCUMENTS

| 6,690,735 | B1 * | 2/2004 | Maddiotto et al. | 375/346 |
| 6,694,131 | B1 * | 2/2004 | Lakkis | 455/302 |
| 6,748,200 | B1 * | 6/2004 | Webster et al. | 455/296 |
| 7,020,226 | B1 * | 3/2006 | Kirkland | 375/355 |
| 7,031,687 | B2 * | 4/2006 | Kivekas et al. | 455/313 |
| 2002/0097812 | A1 | 7/2002 | Wiss | |
| 2002/0127982 | A1 * | 9/2002 | Haapoja et al. | 455/314 |

FOREIGN PATENT DOCUMENTS

| EP | 0 984 288 A1 | 3/2000 |
| EP | 1 241 779 A2 | 9/2002 |

OTHER PUBLICATIONS

M. Valkama et al.: "Advanced methods for I/Q imbalance compensation in communication receivers" IEEE Transactions on Signal Processing, vol. 49, No. 10, Oct. 2001, pp. 2335-2344, XP002240824.

(Continued)

*Primary Examiner*—Quochien B. Vuong
(74) *Attorney, Agent, or Firm*—Sughrue Mion Pllc.

(57) ABSTRACT

The invention relates to a direct conversion receiver for down-converting a received multi-carrier signal comprising at least a first and a second carrier signal at image carrier frequencies to a base band resulting in that the first carrier signal includes an image signal of said second carrier signal. Further, the known direct conversion receiver comprises at least a first and a second digital down-converter unit for separating the first and the second carrier signal from the down-converted multi-carrier signal after digitization. In order to make such receivers less complex and adjust them for fast time varying szenarios it is proposed to provide an error estimating unit to said receivers for calculating a compensating coefficient representing the quota and/or the phase position of the image signal of the second carrier signal being included in the first carrier signal and to remove the undesired image signal in response to said compensating coefficient.

14 Claims, 4 Drawing Sheets

OTHER PUBLICATIONS

Valkama et al.: "On the performance of interference canceller based I/Q imbalance compensation" Proceedings of ICASSP 2000, vol. 5,. Jun. 5, 2000, pp. 2885-2888, XP010506610.

M. Valkama et al: "Advanced DSP for I/Q Imbalance Compensation in a low-IF receiver" IEEE International Conference on Communications, vol. 2, 2000, pp. 768-772, XP002240825.

Schuchert A et al: "A novel IQ imbalance compensation scheme for the reception of OFDM signals" IEEE Transactions on Consumer Electronics, IEEE Inc. New York, US, vol. 47, No. 3, Aug. 2001, pp. 313-318, XP002217600.

Faulner, et al: "Automatic Adjustment of Quadrature Modulators", Electronic Letters, vol. 27, No. 3, Jan. 31, 1992, pp. 214-216.

* cited by examiner

DIRECT CONVERSION RECEIVER

TECHNICAL FIELD

The invention relates to a direct conversion receiver DCR, for receiving a multi-carrier signal including at least a first and a second carrier signal, being located at a first and second image carrier frequency, respectively, via an antenna. The invention further relates to a method for receiving such a multi-carrier signal, a computer program for carrying out such a method and an error estimating unit as well as to a compensator stage of such a direct conversion receiver. The invention is based on a priority reference EP 02 360 380.6 which is hereby incorporated by reference.

BACKGROUND OF THE INVENTION

Direct conversion receivers DCR are substantially known in the art. They typically comprise a front end unit for receiving the multi-carrier signal from the antenna and a quadrature demodulator for down-converting said received multi-carrier signal to a base band. Disadvantageously the down-converting process results in that the first carrier signal includes an image signal of said second carrier signal and vice versa.

Figure 7:
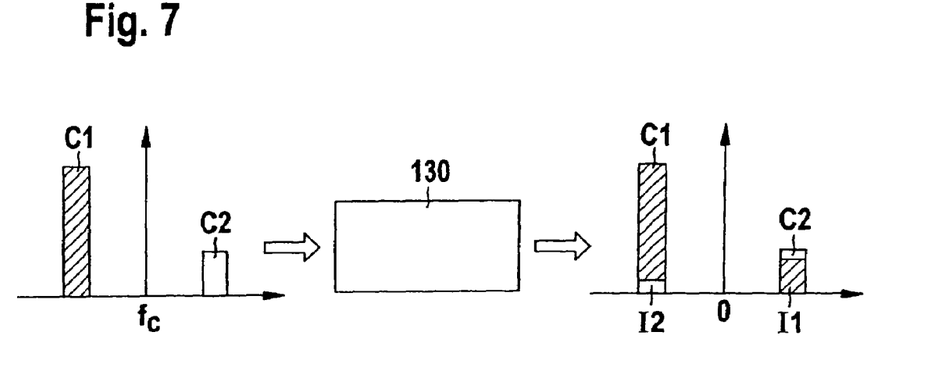
FIG. 7 shows the variation of carrier signals caused by a quadrature-demodulating process as known in the art.

FIG. 7 illustrates the generation of the image signals I1, I2 during a conventional quadrature demodulation process. In the left part of FIG. 7 there is shown the multi-carrier signal as received via the antenna. It comprises for example a first carrier signal C1 and a second carrier signal C2 which are both free of image signals. These carrier signals are located at a first and a second mirror carrier frequency, respectively. These mirror carrier frequencies are arranged symmetrically around a center frequency $f_c$. In the right-hand part of FIG. 7 there are shown the carrier signals after the converting process as carried out by the quadrature demodulator. It can be seen that the down-converted first carrier signal C1 comprises an image signal I2 of the second carrier signal C2 and that said second carrier signal comprises an image signal I1 of the second carrier signal C2. These image signals are undesired because they make a reconstruction of the desired carrier signal more difficult. The difficulty of reconstruction depends on the ratio of image signal to carrier signal which itself depends on the level of impairments in the realisation of the analog quadrature demodulator (gain, phase & quadrature mismatches) as well as similar defects in the A to D converter chain.

The traditional direct conversion receiver DCR further comprises an analog/digital converter for digitizing the down-converted multi-carrier signal and at least a first and a second down-converter DDC-unit for separating the first and the second carrier signal from the digitized down-converted multi-carrier signal and for translating the separated first and second carrier signal to be centered at a predetermined frequency in the frequency plane. In the right-hand part of FIG. 7 said predetermined frequency is set to 0.

In the prior art several methods are known to reject the undesired image signals. For quadrature modulators such a method is known for example from the article "Automatic Adjustment of Quadrature Modulators" by Faulkner, Mattsson and Yates in "Electronic Letters", vol. 27 no. 3, 31$^{st}$ Jan. 1991. The method of image rejection disclosed in said article can substantially also be applied to quadrature demodulators. However, said method requires quite complex electronic circuits and/or a special signal for calibration. Further, the method of image rejection proposed by said article is made iteratively with the result that it can not be applied to fast-time varying scenarios, such as those encountered for example in multicarrier receivers used according to GSM standard with fast frequency hopping and uplink discontinuous transmission.

Starting from that prior art it is the object of the invention to improve a known direct conversion receiver and a method for receiving a multi-carrier signal, a computer program for carrying out said method as well as an error estimating unit and a compensator stage of such a direct conversion receiver such that image rejection can be carried out less complex and with better accuracy and stability.

This object is solved by the subject-matter of claim 1. More specifically, for the above-described direct conversion receiver this object is solved by providing an error estimating unit for calculating a compensating complex coefficient representing the quota and/or the phase position of the image signal of the second carrier signal being included in the first carrier signal and at least a first compensator stage for removing the undesired image signal from the first carrier signal in response to said compensating coefficient.

SUMMARY OF THE INVENTION

The implementation of a such constructed direct conversion receiver is rather simple and allows an easy image rejection. It is another advantage of the invention that in all embodiments the compensating coefficient is at once calculated correctly so that a sufficient suppression of the image signals in the carrier signals is achieved and that a further processing of the carrier signal is possible; consequently, for most of the applications no further adaptation of said compensating coefficient, e.g. by carrying out further iterations, is required. The term 'direct' in direct conversion receiver means that A to D conversion is done directly in baseband representation of a complex analog signal as opposed to intermediate frequency sampling and digitizing method where the image problem does not exist but exibit much higher performance requirements for the A to D converter. Namely, the patent applies also to a superheterodyne receiver with a 1$^{st}$ intermediate frequency band.

As a summary the patent applies to any receiver where an analog complex representation of the received band is digitized by a set of A to D converters.

According to a first embodiment the compensating coefficients are calculated from the translated down-converted carrier signals as output by the DDC-units and provided to compensator stages which are connected in series behind said DDC-units, respectively. Due to said open loop construction an iterative adaptation of the compensating coefficient is neither possible nor required because the accuracy of the calculated compensating coefficient is sufficient to achieve a proper removement of the image signals for most applications.

According to several other embodiments of the invention, the compensating coefficient is calculated in an iterative process in which the at least partially cleaned output signal of the direct conversion receiver are considered.

However, the process for optimizing the compensating coefficients according to the invention is rather quick so that typically only one iteration loop has to be carried out for achieving a proper compensating coefficient which is already able to suppress the undesired image signals sufficiently and which allows a further processing of the carrier signals. However, for applications which require a rather clean signal these embodiments allow further iteration loops in which the compensating coefficient is further optimized.

Advantageous embodiments of the DCR, in particular of its compensating stages and of its error estimating unit are subject-matters of the dependent claims.

The above identified object is further solved by a method for receiving a multi-carrier signal and for rejecting undesired images within these carrier signals and by a computer program for carrying out said method. Moreover, the object is solved by an error estimating unit and by a compensator stage of a direct conversion receiver. The advantages of said solutions correspond to the advantages mentioned above with respect to the direct conversion receiver.

BRIEF DESCRIPTION OF THE DRAWINGS

The invention will now be described in the form of advantageous embodiments by referring to the seven figures accompanying the description wherein.

DETAILED DESCRIPTION OF PREFERRED EMBODIMENTS

Figure 1:
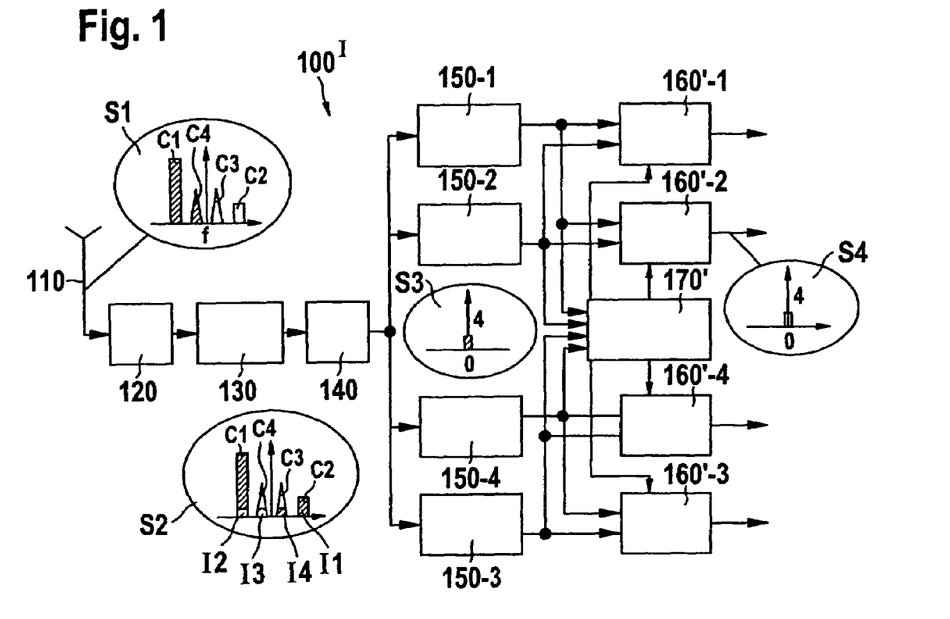
FIG. 1 shows a first embodiment of the direct conversion receiver according to the invention.

FIG. 1 shows a first embodiment of the direct conversion receiver DCR 100' according to the invention.

Said DCR 100' serves for receiving a multi-carrier signal including at least a first and a second carrier signal—see spot S1—being located at image carrier frequencies via an antenna 110. After passing a front end 120 that can include itself some frequency band transposition the multi-carrier signal is directly down-converted to base band by a quadrature demodulator 130. The limited image rejection capabilities of said traditional quadrature demodulator 130 cause a superposition of the desired carrier signals and their images as described above by referring to FIG. 7. This effect is further illustrated for a multi-carrier signal comprising four carrier signals C1, C2, C3 and C4 by the spots S1 and S2 shown in FIG. 1. The images caused by the carrier signals C1 . . . C4 are assigned by the reference numerals I1 . . . I4, respectively.

After being output by the quadrature demodulator 130 the inphase and quadrature components of the complex baseband are respectively digitized by analog/digital AD-converters 140. Subsequently, the carriers included in the multi-carrier base band signal are separated by digital down-converters DDCs 150-1 . . . 150-4 which are individually provided for each of said carriers. In FIG. 1 there are provided four DDCs for separating the four carriers C1 . . . C4 as shown in the spots S1 and S2. Further, the DDCs serve for translating the carrier signals in frequency to be centered at 0 Hz in the frequency plane. At the output of the DDCs the image signal components I1 . . . I4 are still present within the carrier signals C1 . . . C4.

According to the proposed invention each of the separated carriers C1 . . . C4 is subsequently processed in an individually co-ordinated compensator stage 160'-1 . . . 160'-4. More specifically, the translated first carrier signal output by the first DDC 150-1 is processed by the first compensator stage 160'-1. The same co-ordination applies to the other DDCs and compensator stages. The compensator stages 160'-1 . . . 160'-4 remove the undesired image signals from the carrier signals in response to a provided compensating coefficient. Consequently, in the first embodiment according to FIG. 1 each of said compensator stages 160'-1 . . . 160'-4 outputs a cleaned carrier signal which is free of an undesired image signal component; this image rejection effect of the compensator stages is illustrated by the spots S3 and S4 in FIG. 1.

For carrying out said image rejection the compensator stages 160'-1 . . . 160'-4 need information about the quota/magnitude and/or the phase of the undesired image signal component to be removed. This information is provided to the compensator stages by said compensating coefficients which are individually calculated by an error estimating unit 170 for each of said compensating stages. In order to distinguish the compensating coefficients calculated in the first embodiment from the compensating coefficients calculated in the other embodiments which will be described later, the compensating coefficients in the first embodiment are referred to as first type of compensating coefficients.

The error estimating unit 170' of the first embodiment is embodied to calculate a first type compensating coefficient representing the amplitude/quota and/or the phase position the undesired image signal within the carrier signal to be cleaned. More specifically, according to FIG. 1 it is assumed that the first carrier signal C1 includes an undesired image of the second carrier signal C2 and vice versa. Moreover, it is assumed that the third carrier signal C3 includes—after down-converting—an image I4 of the fourth carrier signal C4 and vice versa. Consequently, the first compensator stage 160-1 is embodied to reject the image I2 of the second carrier signal C2 from the first carrier signal C1. For achieving this, the first compensator stage 160'-1 receives both, the first and the second carrier signal as well as its individual compensating coefficient.

The error estimating unit 170' in principle generates said compensating coefficients by correlating the output of the DDCs for the desired carrier signal with the DDC output of the image carrier. For example, for generating the individual compensating coefficient CC1 for the first compensator stage 160'-1 the error estimating unit 170' correlates the output of the first DDC 150-1 for the first carrier signal which shall be cleaned with the output of the second DDC 150-2, i.e. the translated second carrier signal, an image of which is included in the translated first carrier signal. From said complex compensating coefficient CC1 and from the levels of the two input signals, i.e. the translated down-converted first and second carrier signals the first compensator stage 160'-1 calculates the cleaned first carrier signal.

Often, the compensating coefficients only vary slow versus time. For this case it is sufficient to compute these compensating coefficients CCi with 1-4 from time to time. The compensating coefficients may be computed sequentially and offline with the result that only limited hardware and/or software resources are required.

However, if online/real time image rejection is required, the compensator stages 160'-1 . . . 160'-4 have to buffer a certain portion of their above-mentioned input signals in order to await the provision of the corresponding compensating coefficient from the error estimating unit 170'. After the error estimating unit 170' has evaluated the translated and down-converted first and second carrier signal the first compensating coefficient CC1 representing the amplitude/quota and/or the phase position of the image signal of the second carrier signal within the translated and down-converted first carrier signal is calculated.

Subsequently, this compensating coefficient CC1 is provided to the first compensator stage 160'-1. In said compensator stage 160'-1 the buffered input signals are processed by using said compensating coefficient CC1 in order to generate the desired clean first carrier signal.

In the whole description, the term "clean" means a lack of image signals within a carrier signal. Due to its individual calculation the compensating coefficient CC1 it is highly accurate with the result that the undesired image signal components within the cleaned carrier signals are sufficiently suppressed for most applications; usually, no further adaptation of the compensating coefficient CC1 is necessary and thus the described method is best suited for fast varying scenarios.

The above-described operation of the error estimating unit 170' and the first compensator stage 160'-1 also applies to the operation of the other compensator stages 160'-2, 160'-3 and 160'-4 shown in FIG. 1.

Figure 2:
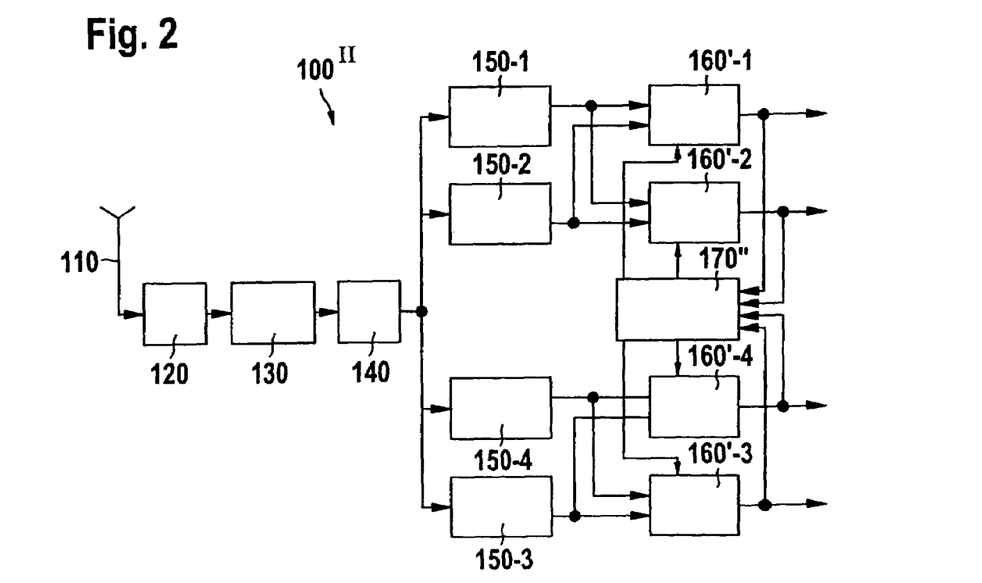
FIG. 2 shows a second embodiment of the direct conversion receiver according to the invention.

FIG. 2 shows a second embodiment of the direct conversion receiver according to the present invention. Here, the antenna 110, the front end 120, the quadrature demodulator 130, the analog/digital converters 140, the direct downconverters 150-1, 150-4 and the indirect compensator stages 160'-1 . . . 160'-4 as well as the operations of said components are identical to the components being identified by the same reference numerals and operations thereof described above for the first embodiment.

However, the second embodiment of the DCR according to FIG. 2 differs from the first embodiment in that the input for the error estimating unit 170" is now taken from the output of the compensator stages 160'-1 . . . 160'-4. The effect is that the error estimation operates in an iterative manner. The remaining image components at the outputs of the compensator stages 160'-1 . . . 160'-4 are used to refine the compensating coefficients CC1 with i=1-4 in an iteration loop. Advantageously, said proposed iteration converges very fast so that normally only one iteration loop is sufficient for sufficiently suppressing the image signals.

Figure 3:
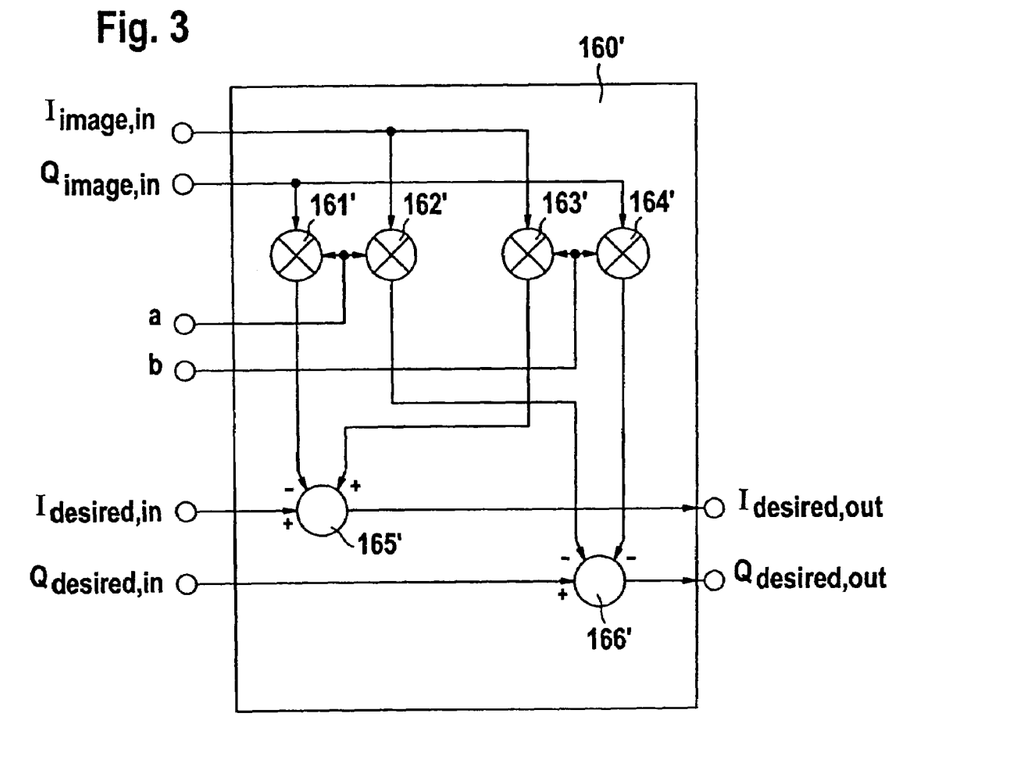
FIG. 3 shows a preferred embodiment of an indirect compensator according to the invention as used in the first and the second embodiment of the direct conversion receiver.

FIG. 3 shows a preferred embodiment of the indirect compensator stages 160'-1 . . . 160'-4 as used in the first and second embodiment of the DCR in FIGS. 1 and 2, respectively.

From FIG. 3 it is apparent that each of the compensator stages receives the real component $I_{desired, in}$ of the translated carrier signal to be cleaned. Further, the imaginary component $Q_{desired, in}$ of the translated carrier signal to be cleaned is received. For calculating the cleaned components $I_{desired, out}$ and $Q_{desired, out}$ the compensator stages 160' further receive the real component $I_{image, in}$ of that translated carrier signal, an image of which is included in the translated carrier signal which is desired to be cleaned. Further, the indirect compensator stage 160' receives the imaginary component $Q_{image, in}$ of the translated carrier signal an image of which is included in the translated carrier signal desired to be cleaned at the port. Finally, the indirect compensator stage 160 receives the real component a and the imaginary component b of the co-ordinated compensating coefficient.

For calculating the desired cleaned output signal preferably each of the compensator stages 160' comprise a first multiplying unit 161' for multiplying the imaginary component of the translated image carrier signal with a real component of the compensating coefficient a. Further, it comprises a second multiplying unit 162' for multiplying the real component of said translated image carrier signal $I_{image, in}$ with the real component a of the compensating coefficient. Moreover, it comprises a third multiplying unit 163' for multiplying the real component of the translated image carrier signal $I_{image, in}$ with the imaginary component b of the compensating coefficient and a fourth multiplying unit 164' for multiplying the imaginary component of the translated image carrier signal $Q_{image, in}$ with the imaginary component b of the compensating coefficient. Further, each of the compensating stages comprise a first adding unit 165' for generating a real component of the desired cleaned carrier signal by adding the output of the third multiplying unit 163' to the real component of the translated carrier signal desired to be cleaned and by substracting the output of the first multiplying unit 161' therefrom. Finally, each of the compensator stages 160' comprises a second adding unit 166' for generating an imaginary component the of cleaned carrier signal by substracting the output of the second multiplying unit 162' and the output of the fourth multiplying unit 164' from the imaginary component of the translated carrier signal $Q_{desired, in}$ required to be cleaned.

Mathematically, the operation of the direct compensator stages 160' can be described by the following transfer function:

$$S_{desired, out} = S_{desired, in} - S^*_{image, in} \cdot C$$

wherein $S_{desired, out}$ represents the desired complex output signal after correction;

$S_{desired, in}$ represents the desired complex input signal before correction;

$S^*_{image, in}$ represents the frequency inverted complex input image signal; and c represents a complex scaling factor Split up into a real and an imaginary components equation 1 may be written according to:

$$I_{desired, out} = I_{desired, in} - a \cdot Q_{image, in} + b \cdot I_{image, in} \quad (2)$$

$$Q_{desired, out} = Q_{desired, in} - a \cdot i_{image, in} - b \cdot Q_{image, in} \quad (3)$$

wherein $I_x$ represents the real part of a signal (in phase component)

$Q_x$ represents the imaginary part of a signal (quadrature component)

a represents the real component of c b represents the imaginary component of c.

Figure 4:
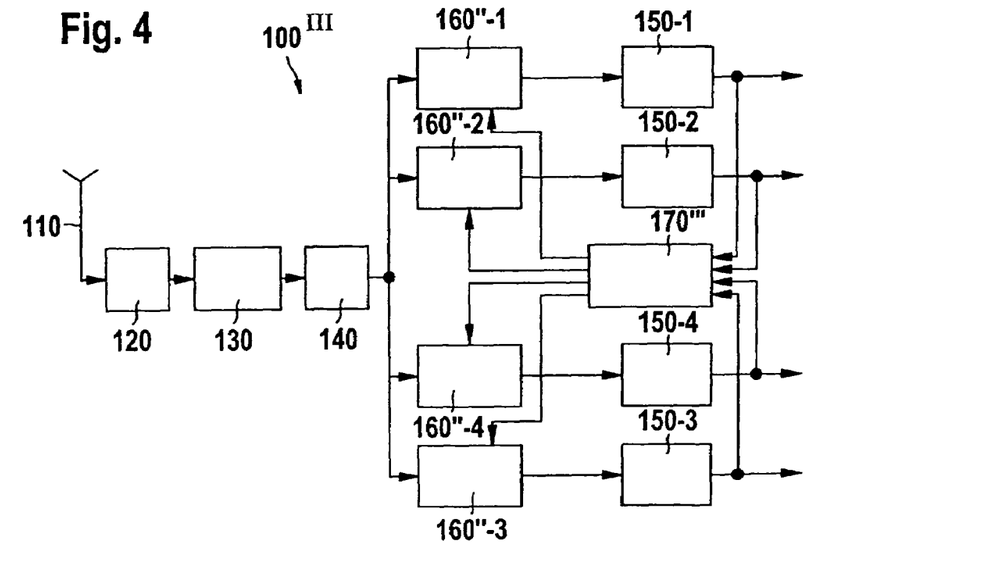
FIG. 4 shows a third embodiment of the direct conversion receiver according to the invention.

FIG. 4 shows a third embodiment of the direct conversion receiver according to the invention. The operation of the antenna 110, the front end 120, the quadrature demodulator 130, the A/D-converter 140 and of the direct down-converters 150-1 . . . 150-4 and the operations of these components are the same as described above.

However, the third embodiment of the direct conversion receiver differs from the second embodiment substantially in that the compensator stages 160"-1 . . . 160"-4 are now connected in series between the A/D-converter 140 and the digital down-converters 150-1. Thus, the digitized multi-carrier signal output by said A/D-converter 140 is now received by said compensator stages 160"-1 . . . 160"-4 and these compensator stages output a cleaned multi-carrier signal; i.e. the output multi-carrier signal is substantially free of undesired image signals. The cleaned multi-carrier signals output by the compensator stages 160"-1 ... 160"-4 are received by the individually co-ordinated digital down-converters 150-1 ... 150-4 for separating individual carriers from said cleaned multi-carrier signal.

Expressed in other words, in comparison to the embodiments 1 and 2 the cleaning process carried out by the compensator stages is carried out here before the separation process is carried out by the DDCs. However, in difference to embodiments 1 and 2 the compensating coefficients (third type) are now calculated in response to the output signal of the DDCs channels. In that way an individual adaptation of the compensating coefficient with regard to the carrier signal to be selected from the multi-carrier signal can be provided to said compensating stages 160"-1 ... 160"-4. The error estimating unit which is embodied to calculate these individual compensating coefficients is in embodiment 3 assigned by the reference numeral 170'''.

Figure 5:
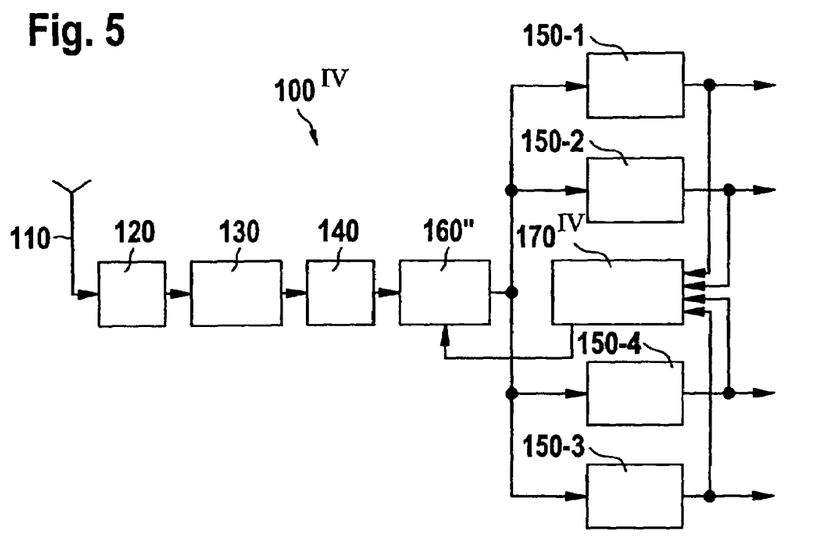
FIG. 5 shows a fourth embodiment of the direct conversion receiver according to the invention.

FIG. 5 shows a fourth embodiment of the claimed direct conversion receiver DCR. The construction of that fourth embodiment only differs from the third embodiment in that it is facilitated in the way that the plurality of compensator stages used in the third embodiment is here replaced by only one single compensating stage 160". Due to that facilitation the error estimator unit 170$^{IV}$ now generates only one fourth-type compensating coefficient for said single compensator stage 160" in response to the individual signals output by said digital down-converters 150-1 ... 150-4. Because now there is only one compensating coefficient provided to said single compensator stage said compensating coefficient is not individually adapted to each of the carrier signals included within the multi-carrier signal processed by said compensating stage and which are subsequently to be separated by said digital down-converters 150-1 ... 150-4. Consequently, the rejection of undesired image signals within the signals output by said digital down-converters is only suboptimal in comparison to for example embodiment 3. However, like in embodiments 2 and 3, in embodiment 4 the generation of the compensating coefficient is also done in the form of a closed loop. Consequently, also in embodiment 4 an arbitrary accuracy of the compensating coefficient may be achieved perhaps by carrying out the closed loop for some more times than in the other embodiments.

Figure 6:
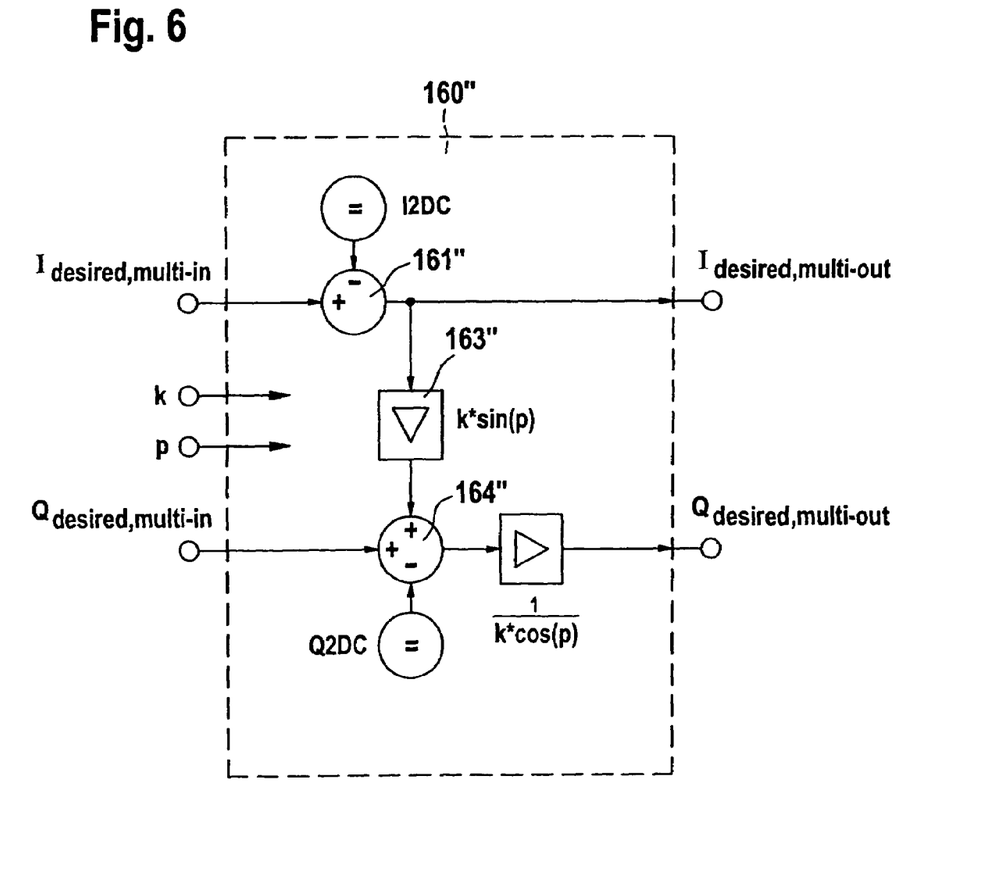
FIG. 6 shows a direct compensator according to the invention as used in the embodiments 3 and 4 of the direct conversion receiver.

FIG. 6 shows a preferred embodiment of the compensator stages 160"-1 ... 160"-4 or 160" as used in embodiments 3 and 4. As can be seen, said compensator stage receives a real component $I_{desired,multi-in}$ and an imaginary component $Q_{desired,multi-in}$ as well as the magnitude k and the phase p of the compensating coefficient for the multi-carrier signal as generated by the error estimating unit 170$^{IV}$. For generating the real component $I_{desired,multi-out}$ of the cleaned multi-carrier signal a constant I2DC is subtracted from the received real component $I_{desired,multi-in}$. For enabling that operation the compensator stage 160" comprises a substracting unit 161".

Further, the compensator stage 160" comprises a first multiplier 163" for multiplying the real component $I_{desired,multi-out}$ of the generated cleaned multi-carrier output signal with a first factor x1=k·sin(p) wherein k represents the magnitude of the compensator coefficient and p represents the phase of said compensator coefficient.

Said first multiplier 163" generates a first intermediate signal. Further, the compensating stage 160" comprises a second substracting unit 164" for generating a second intermediate signal by adding the first intermediate signal to the imaginary component $Q_{desired,multi-in}$ of the received multi-carrier signal and by substracting a second constant Q2DC therefrom. Finally, for generating the desired imaginary component $Q_{desired,multi-out}$ of the cleaned multi-carrier signal the compensating stage 160" comprises a second multiplier 165" for multiplying said second intermediate signal with a second factor x2=1: (k·cos(p)).

The operation of said compensating stage 160" may mathematically be described by the following algorithm:

$$I_{desired,multi-out} = I_{desired,multi-in} - I_{2DC}$$

$$Q_{desired,multi-out} = \frac{Q_{desired,multi-in} - Q_{2DC} + (I_{desired,multi-in} - I_{2DC}) \cdot k \cdot \sin(p)}{k \cdot \cos(p)}$$

Finally, the general operation of the error estimating unit 170$^I$ ... 170$^{IV}$ as used in all of the embodiments according to the invention shall be mathematically described. The error estimating unit serves—as outlined above—to estimate the unknown compensating coefficients, that means in particular the amplitude and the phase imbalance in case of direct error compensation as used in embodiments 3 and 4 or in the form of a complex scaling factor, that means in the form of real component and imaginary component in the case of an indirect error compensation as used or done in embodiments 1 and 2. According to the invention, error estimation is done by correlating the "frequency inverted" signal of the corresponding image channel with the signal of the desired channel. The scaled complex correlation coefficient is used to compute the scaling factor used for indirect compensation whereas the scaled correlation coefficient is used to compute the amplitude and the phase imbalance of the real and imaginary component of the demodulator. The algorithm is described as follows:

$$xy = \sum_{i=1}^{n} (Q_{i,desired} \cdot I_{i,image} + I_{i,desired} \cdot Q_{i,image}) +$$

$$j \cdot (Q_{i,desired} \cdot Q_{i,image} - I_{i,desired} \cdot I_{i,image})$$

$$xxw = \sum_{i=1}^{n} I_{i,desired}^2 + Q_{i,desired}^2$$

$$xxi = \sum_{i=1}^{n} I_{i,image}^2 + Q_{i,image}^2$$

$$c = \frac{xy}{xxi} \cdot \left[1 - 0.5 \cdot \left(\frac{xxw}{xxi}\right)^2\right] \text{ for } xxi \geq xxw$$

$$c = \frac{xy}{xxw} \cdot \left[1 - 0.5 \cdot \left(\frac{xxi}{xxw}\right)^2\right] \text{ for } xxi < xxw$$

$$k = 1 + 2.047 \cdot \text{imag}(c)$$

$$p = -2 \cdot \text{real}(c)$$

k & p formulas are here fist order approximations but precise enough to ensure fast convergence in the iterative embodiment described here.

with $x_1$ representing a complex correlation coefficient between the desired and image signal;

xxw representing the energy of desired signal sequence;

xxi representing the energy of image signal sequence;

$I_i$ representing the inphase component of sample i;

$Q_i$ representing the quadrature component of sample i;

n representing the number of samples taken for correlation, e.g. on radio slot;

c representing a scaling factor needed for indirect compensator method;
k representing the amplitude imbalance of IQ demodulator;
p representing the phase imbalance of the IQ demodulator in rad.

In all embodiments of the invention the number of DDCs and/or compensator stages preferably corresponds to the number of carriers comprised within the received multi-carrier signal. The numbers are not limited for any embodiment of the invention, even if some embodiments have only been described for two carriers in order to facilitate the illustration.

The same remark applies for links between imaged carriers. For simplicity of description especially in FIGS. 1 and 2 and associated descriptions, images links have been predetermined.

In the general case it is assumed to be part of box 170 variants to also detect & predict, especially in frequency hopping mode and discontinuous reception, which are the carriers subject to be coupled with an imaged one.

In case of no image carrier for a given active carrier, then it is up to box 170 to temporarily stop updating the coefficient update and hold the former value for the time where image will reappear. Also for inputs of boxes 160 the box 170 can in that case force coefficient to zero.

The invention claimed is:

1. A direct conversion receiver DCR for receiving a multi-carrier signal including at least a first and a second carrier signal, being located at image carrier frequencies, via an antenna, comprising:
  a quadrature demodulator for down-convening said multi carrier signal to a baseband resulting in that the first carrier signal includes an image signal of said second carrier signal and that the second carrier signal includes an image signal of said first carrier signal;
  analog to digital AD converters for digitizing the down-converted multi-carrier complex signal;
  at least a first and a second digital down convener DDC unit for separating the first and the second carrier signal from the digitized down-convened multi-carrier signal and for translating the separated first and second carrier signal to be centered at a predetermined frequency in the frequency plane, respectively;
  an error estimating unit for calculating a compensating coefficient representing the quota and/or the phase position of the image signal of the second carrier signal being included in the fist carrier signal and a compensating coefficient representing the quota and/or the phase position of the image signal of the first carrier signal being included in the second carrier signal; and
  at least a first compensator stage for removing the undesired image signal from the first carrier signal in response to said compensating coefficient representing the quota and/or the phase position of the image signal of the second carrier signal being included in the first carrier signal.

2. The direct conversion receiver according to claim 1, wherein
  the error estimating unit is embodied to calculate a first type of the compensating coefficient in response to the received translated first and second carrier signal output by the first and second digital down converter, respectively; and the first compensator stage also receiving the translated first and second carrier signal output by the first and second digital down converter, respectively and outputting a cleaned first carrier signal in which the undesired image signal from the second carrier signal is removed in response to a first one of said first type compensating coefficient; and
  a second compensator stage also receiving the translated first and second carrier signal output by the first and second digital down converter, respectively, and outputting a cleaned second carrier signal in which the undesired image signal from the first carrier signal is removed in response to a second one of said first type compensating coefficient.

3. The direct conversion receiver according to claim 2, wherein the error estimating unit is embodied to calculate the compensating coefficient as scaled complex correlation coefficient by correlating a frequency inversion of the second signal—as output by the second DDC or by the second compensator stage—the image of which is undesirably included within the first carrier signal, with the desired first carrier signal as being output by the first DDC.

4. The direct conversion receiver according to claim 2, wherein the error estimating unit is embodied to calculate the compensating coefficient as scaled complex correlation coefficient by correlating a frequency inversion of the second signal—as output by the second compensator stage—the image of which is undesirably included within the first carrier signal, with the desired first carrier signal as being output by the first compensator stage.

5. The direct conversion receiver according to claim 1, wherein
  the first compensator stage is embodied to receive the translated first and second carrier signal output by the first and second digital down converter, respectively and to output a cleaned first carrier signal in which the undesired image signal from the second carrier signal is at least partially removed in response to a first one of a second type of compensating coefficient;
  a second compensator stage is embodied to receive the translated first and second carrier signal output by the first and second digital down converter, respectively and to output a cleaned second carrier signal in which an undesired image signal from the, first carrier signal is removed in response to a second one of a second type of compensating coefficient; and the error estimating unit is embodied to calculate said first and second ones of the second type of compensating coefficients in response to the received cleaned first and second carrier signal output by the first and second compensator stage, respectively.

6. The direct conversion receiver according to claim 2 or 5, characterized in that the first or second compensator stage comprises
  a first multiplying unit for multiplying an imaginary component of the translated second carrier signal output by the second digital down converter with a real component of the compensating coefficient;
  a second multiplying unit for multiplying a real component of the translated second carrier signal output by the second digital down converter with the real component of the compensating coefficient;
  a third multiplying unit for multiplying the real component of the translated second carrier signal output by the second digital down converter with an imaginary component of the compensating coefficient;
  a fourth multiplying unit for multiplying the imaginary component of the translated second carrier signal output by the second digital down converter with the imaginary component of the compensating coefficient;
  a first adding unit for generating a real component of the desired and cleaned first carrier signal by adding the output signal of the third multiplying unit to a real component of the translated first carrier signal output by the first DDC and by subtracting the output signal of the first multiplying unit therefrom; and a second adding unit for generating an imaginary component of the desired and cleaned first carrier signal by subtracting the output signals of the second and the fourth multiplying unit from an imaginary component of the translated first carrier signal output by the second DDC.

7. The direct conversion receiver according to claim 1, wherein the first compensator stage is connected in series between the A/D converter and the first DDC for generating a cleaned digitized and down-converted multi-carrier signal in response to a first one of a third type of compensating coefficients and for providing said cleaned multi-carrier signal to the first DDC;

a second compensator stage is connected in series between the A/D converter and the second DDC for generating a cleaned digitized and down-converted multi-carrier signal in response to a second one of a third type of compensating coefficients and for providing said cleaned multi-carrier signal to the second DDC; and the error estimating unit is embodied to calculate said first and second ones of the third type compensating coefficients in response to the received cleaned first and second carrier signal output by the first and second DDC, respectively.

8. The direct conversion receiver according to claim 7, wherein each of the first or second compensator stage comprises a first subtracting unit for generating a real component of the cleaned digitized and down-converted multi carrier signal by subtracting a predetermined constant from the real component of the digitized and down-converted multi-carrier signal;

a first multiplier for generating a first intermediate signal by multiplying said real component of the cleaned digitized and down-converted multi carrier signal with a first factor x1=k*sin(p), wherein k represents the magnitude of the compensating coefficient and p represents the phase of said compensating coefficient;

a second subtracting unit for generating a second intermediate signal by adding the imaginary component of the digitized and down-converted multi carrier signal to the first intermediate signal and by subtracting a predetermined second constant from said sum; and a second multiplier for generating the imaginary component of the cleaned digitized and down-converted multi carrier signal by multiplying the second intermediate signal with a second factor x2=1/k*cos(p) wherein k represents the magnitude of the compensating coefficient and p represents the phase of said compensating coefficient.

9. The direct conversion receiver according to claim 1, wherein the first compensator stage is connected in series between the A/D converter and the inputs of the first and a second DDC, which are connected in parallel at their input sides, for generating a cleaned digitized and down-convened multi-carrier signal in response to a fourth type compensating coefficient and for providing said cleaned multi-carrier signal to the inputs of the first and the second DDC simultaneously; and the error estimating unit is embodied to calculate said fourth type compensating coefficient in response to the received cleaned first and second carrier signal output by the first and second DDC, respectively.

10. A compensator stage of a direct conversion receiver according to claim 1 for receiving a multi-carrier signal including at least a first and a second carrier signal, being located at image carrier frequencies, via an antenna, the receiver comprising a quadrature demodulator for down-converting said multi carrier signal to a base band resulting in that the first carrier signal includes an image signal of said second carrier signal; an analog to digital AD converter for digitizing the down-converted multi carrier signal;

at least a first and a second digital down-convener DDC unit for separating the first and the second carrier signal from the digitized down-converted multi-carrier signal and for translating the separated first and second carrier signal to be centered at a predetermined frequency in the frequency plane, respectively; and an error estimating unit for calculating a first compensating coefficient representing the quota and/or the phase position of the image signal of the second carrier signal being included in the first carrier signal and a second compensating coefficient representing the quota and/or the phase position of the image signal of the first carrier signal being included in the second carrier signal; wherein the compensator stage is embodied to remove the undesired image signal from the first or second carrier signal in response to said first or second compensating coefficient, respectively.

11. The compensator stage according to claim 10, wherein the direct conversion receiver is characterized in that the error estimating unit is embodied to calculate a first type of the compensating coefficient in response to the received translated first and second carrier signal output by the fist and second digital down converter, respectively; and the first compensator stage also receiving the translated first and second carrier signal output by the first and second digital down converter, respectively and outputting a cleaned first carrier signal in which the undesired image signal from the second carrier signal is removed in response to said first type compensating coefficient and wherein the first compensator stage comprises;

a first multiplying unit for multiplying an imaginary component of the translated second carrier signal output by the second digital down-converter with a real component of the compensating coefficient;

a second multiplying unit for multiplying a real component of the translated second carrier signal output by the second digital down converter with the real component of the compensating coefficient;

a third multiplying unit for multiplying the real component of the translated second carrier signal output by the second digital down converter with an imaginary component of the compensating coefficient;

a fourth multiplying unit for multiplying the imaginary component of the translated second carrier signal output by the second digital down-converter with the imaginary component of the compensating coefficient;

a first adding unit for generating a real component of the desired and cleaned first carrier signal by adding the output signal of the third multiplying unit to a real component of the translated first carrier signal output by the first DDC and by subtracting the output signal of the first multiplying unit therefrom; and a second adding unit for generating an imaginary component of the desired cleaned first carrier signal by subtracting the output signals of the second and the fourth multiplying unit from an imaginary component of the translated first carrier signal output by the second DDC.

12. A method for receiving a multi-carrier signal including at least a first and a second carrier signal, being located at image carrier frequencies, via an antenna, comprising the steps of:

down-convening said received multi carrier signal to a baseband resulting in that the first carrier signal includes an image signal of said second carrier signal;

digitizing the down-converted multi carrier signal;

separating the first and the second carrier signal from the digitized down-converted multi-carrier signal; and translating the separated first and second carrier signal to be centered at a predetermined frequency in the frequency plane, calculating, in response to the separated first and second carrier signals, a first compensating coefficient representing the quota and/or the phase position of the image signal of the second carrier signal being included in the first carrier signal, and a second compensating coefficient representing the quota and/or the phase position of the image signal of the first carrier signal being included in the second carrier signal; and removing the undesired image signal from the first and second carrier signals in response to said first and second compensating coefficients, respectively.

13. A computer readable storage medium storing a computer executable program of a direct conversion receiver comprising a program code being embodied to carry out the method according to claim 12.

14. An error estimating unit for a direct conversion receiver DCR receiving a multi-carrier signal including at least a first and a second carrier signal, being located at image carrier frequencies, via an antenna, and down-converting said multi-carrier signal to a baseband resulting in that the first carrier signal includes an image signal of said second carrier signal and the second carrier signal includes an image signal of said first carrier signal, wherein the error estimating unit is embodied to calculate a first compensating coefficient representing the quota and/or the phase position of the image signal of the second carrier signal being included in the first carrier signal and a second compensating coefficient representing the quota and/or the phase position of the image signal of the first carrier signal being included in the second carrier signal.

* * * * *